United States Patent
Bodano et al.

(10) Patent No.: US 9,178,522 B2
(45) Date of Patent: Nov. 3, 2015

(54) ANALOG-TO-DIGITAL CONVERTER AND CONTROL CIRCUIT WITH A LOW QUIESCENT CURRENT AT LOW LOAD

(71) Applicant: Infineon Technologies AG, Neubiberg (DE)

(72) Inventors: Emanuele Bodano, Villach (AT); Peter Bogner, Villach (AT); Joachim Pichler, Landskron (AT); Mark Schauer, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/476,638

(22) Filed: Sep. 3, 2014

(65) Prior Publication Data

US 2015/0061912 A1 Mar. 5, 2015

(30) Foreign Application Priority Data

Sep. 3, 2013 (DE) .................... 10 2013 014 649

(51) Int. Cl.
| | |
|---|---|
| H03M 7/00 | (2006.01) |
| H03M 1/00 | (2006.01) |
| H03M 1/44 | (2006.01) |
| H03M 1/46 | (2006.01) |
| G05F 1/575 | (2006.01) |
| H03M 1/38 | (2006.01) |

(52) U.S. Cl.
CPC .............. H03M 1/002 (2013.01); G05F 1/575 (2013.01); H03M 1/38 (2013.01); H03M 1/44 (2013.01); H03M 1/46 (2013.01)

(58) Field of Classification Search
CPC ........... H03M 1/38; H03M 1/44; H03M 1/46; H03M 1/002; G05F 1/575
USPC ........................................................ 341/161
See application file for complete search history.

(56) References Cited

U.S. PATENT DOCUMENTS

| | | | |
|---|---|---|---|
| 6,118,400 A * | 9/2000 | Susak | 341/172 |
| 6,417,794 B1 * | 7/2002 | Munoz et al. | 341/161 |
| 6,809,674 B1 | 10/2004 | Ramsden | |
| 7,969,343 B2 * | 6/2011 | Ishikawa | 341/172 |
| 8,018,238 B2 * | 9/2011 | Cormier, Jr. | 324/678 |

FOREIGN PATENT DOCUMENTS

DE 102006025116 A1 12/2007

* cited by examiner

*Primary Examiner* — Brian Young
(74) *Attorney, Agent, or Firm* — SpryIP, LLC

(57) ABSTRACT

A circuit contains a successive approximation register and an adjustable capacitor with a set input for adjusting a capacitance value of the adjustable capacitor. Moreover, it comprises a comparator having an input coupled to a terminal of the adjustable capacitor, and with an at least one output, wherein at least one of the outputs of the comparator is coupled to an input of the successive approximation register. The circuit also includes an analog input which is coupled to a terminal of the adjustable capacitor. The circuit may be set into a first operating state and a second operating state, wherein an output of the circuit is controlled in the first operating state by the successive approximation register and is not controlled in the second operating state by the successive approximation register, but by the comparator.

18 Claims, 3 Drawing Sheets

ANALOG-TO-DIGITAL CONVERTER AND CONTROL CIRCUIT WITH A LOW QUIESCENT CURRENT AT LOW LOAD

RELATED APPLICATION

This Application claims priority benefit of German Patent Application No.: 102013014649.6. The entire contents of the indicated German Patent Application are hereby incorporated herein by reference.

BACKGROUND OF THE INVENTION

Implementations relate to an analog-digital converter (ADC) and control circuit with a low quiescent current at low load and a method for regulating an output voltage.

In voltage regulators, for example, switching power supplies, the power efficiency generally depends on the current consumption. In a low load current condition, the losses of the quiescent currents dominate and in switching power supplies losses of the quiescent currents are affected by switching operations. It special operation modes, pulse frequency modulation (PFM) have been introduced to reduce the number of switching operations. Furthermore, intelligent power control concepts (smart power management concepts) have been introduced to reduce the quiescent currents. Digitally controlled switched power supply converters normally detect a feedback voltage using an ADC. An exemplary analog-to-digital converter is shown in DE 10 2005 030 562 B4.

SUMMARY OF THE INVENTION

Implementations provide an ADC, a circuit for regulating an output voltage and a method of controlling an ADC, with which quiescent current may be reduced.

A circuit contains a successive approximation register and a adjustable capacitor with a set input for adjusting a capacitance value of the adjustable capacitor. Moreover, it comprises a comparator having an input coupled to a terminal of the adjustable capacitor, and with an at least one output, wherein at least one of the outputs of the comparator stage is coupled to an input of the successive approximation register. The circuit also includes an analog input which is coupled to a terminal of the adjustable capacitor. The circuit is set into a first operating state and a second operating state, wherein an output of the circuit is controlled in the first operating state by the successive approximation register and is not controlled in the second operating state by the successive approximation register, but by the comparator.

A method for controlling an output voltage includes some or all of the following. In a first mode of operation, an analog-to-digital converter is operated with a successive approximation register, by adjusting a variable capacitor, which is coupled to one of its terminals with a feedback signal of the output voltage, and an actuator to drive the output voltage in response to an output signal of the successive approximation register. In a second operating mode, a comparator which is connected to a terminal of the adjustable capacitor, and operating the actuator to drive the output voltage is controlled in dependence on an output signal of the comparator and is not a function of the successive approximation register.

BRIEF DESCRIPTION OF THE DRAWINGS

Exemplary embodiments are explained in more detail below with reference to the appended drawings, in which.

DETAILED DESCRIPTION

Figure 1:
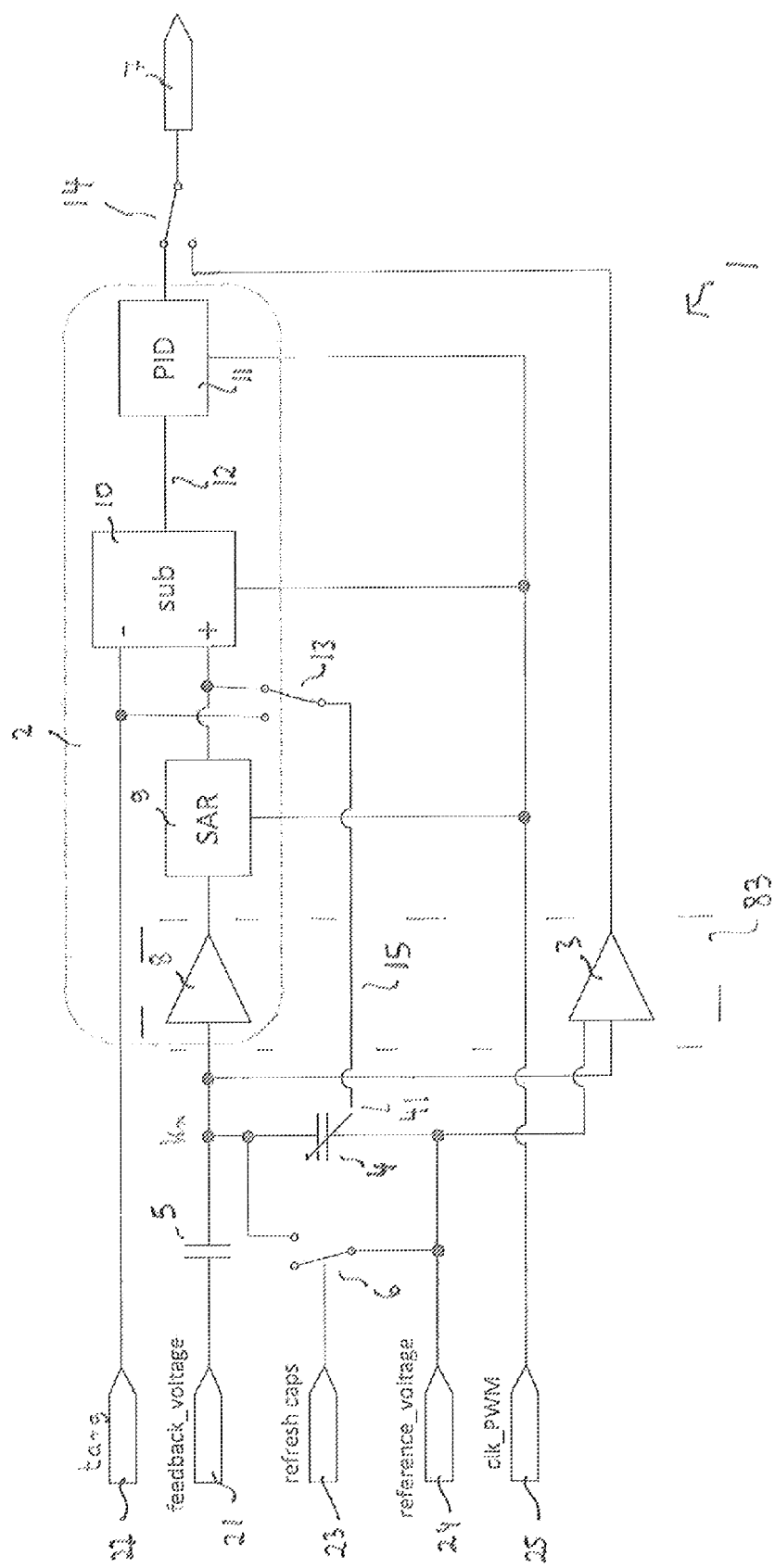
FIG. 1 illustrates an embodiment of a circuit for generating an output voltage in a first operating mode.

FIG. 1 a circuit 1 having five inputs and one output 7. The inputs are an analog input 21, a reference value input 22, a command input 23, a reference voltage input 24 and a clock input 25. The circuit 1 also includes an ADC device 2, including a first comparator 8, a successive approximation register 9, a subtractor 10 and a controller 11. The circuit 1 also includes a capacitor 5, an adjustable or variable capacitor 4, a refresh switch 6, a first mode selector switch 13 and a second mode selector switch 14. The adjustable capacitor 4 includes a set input 41, whereby the capacitance of the adjustable capacitor 4 can be adjusted digitally. In one embodiment, the adjustable capacitor 4 contains an array of individual capacitors that can be switched individually switchable capacitors with other items in parallel. The input signal to the set input 41 determines how many and which individual capacitors are connected in parallel to provide the combined capacitance of the adjustable capacitor 4.

The capacitor 5 is connected with its first terminal to the analog input 21 and its second terminal is connected to an input of the first comparator 8. The refresh switch 6 has two terminals for the load circuit and a control terminal. The control terminal is connected to the command input 23. One terminal of the load path is connected to the input of the first comparator 8, while the other terminal of the load path is connected to the reference voltage input 24. The adjustable capacitor 4 has two terminals, each of terminals connected to an electrode of the adjustable capacitor 4. One of the terminals is connected to the input of the first comparator 8, while the terminal is connected to the reference voltage input 24. Reference voltage input 24 is also connected to a first input of a second comparator 3, which has a second input which is connected to the first input of the first comparator 8.

The output of the first comparator 8 is connected to the input of the successive approximation register, whose output is connected to a non-inverting input of the subtractor 10. An inverting input of the subtractor 10 is connected to the reference value at input 22. The output of subtractor 10 is connected to an input of the controller 11. The output of controller 11 is connected to a first input of the second mode selector switch 14, while the second input of the second mode selector switch 14 is connected to an output of the second comparator 3. The output of the second mode selector switch 14 is connected to the output 7 of the circuit 1. The second mode selector switch 14 has additionally a control input not shown in the figure. The control input causes the second mode selector switch 14 to switch between the two inputs shown in FIG. 1.

The first mode selector switch 13 has two inputs, the first of which is coupled to the reference value input 22 and the second input is coupled to the output of the successive approximation register 9. The output of the first mode selector switch 13 is connected to the set input 41. The first mode selector switch 13 has additionally a control input not shown in the figure. The control input causes the second mode selector switch 13 to switch between the two inputs shown in FIG. 1.

The clock input 25 is connected to clock inputs of the successive approximation register 9, the subtractor 10 and the controller 11.

FIG. 1 illustrates the first mode of operation in which the circuit 1 is switched when the load is medium or large. This mode of operation will be referred below as pulse width modulation mode.

In this operating mode, the first comparator 3, the successive approximation register 9, the subtractor 10 and the controller 11 are turned on and the first mode switch 13 connects the output of the successive approximation register 9 to the set input 41, the second mode selector switch 14 connects, in this mode of operation, the output of the regulator 11 to the output 7.

The capacitors 5 and 4 form a capacitive voltage divider at the connection node Kn, and an electric potential is formed which lies between the potential at the input 21 and the potential at the input 24. The ratio of the voltage between the input 21 and the connection node Kn on the one hand and the voltage between the connection node CN and the input 24 on the other hand corresponds to the ratio of the capacitances of the capacitors 4 and 5. The set input 41 determines how large the capacity of the variable capacitor 4 is, and thus also the ratio of the voltages.

The first comparator 8 compares the potential at the connection node Kn with a predetermined, not shown, potential. The digital output value of the first comparator 8 indicates whether or not the potential at the connection node Kn is above or below the predetermined potential. The successive approximation register 9 receives the output of the first comparator 8 as a binary digital signal and, in turn, changes its output value in the context of successive-approximation. This output is connected by the first mode selector switch 13 to the set input 41, which causes the capacitance of the variable capacitor to be changed in accordance with the signal at the set input 41. Wherein variation of the capacitance of the variable capacitor 4 changes, at constant potentials at the inputs 21 and 24, the potential at the connection node Kn.

The successive approximation register 9 changes its output at timings which are determined by the clock at its clock input. The successive approximation register 9 changes its output value until the potential at the connecting node corresponds to the predetermined potential. The output of the successive approximation register 9 is a measure of the voltage between the feedback potential at the input 21 and the reference potential at the input 24, after the approximation.

The output of the successive approximation register 9 is provided as a digital input signal and is subtracted in the subtractor 22 from targ input signal received on reference value input 22. The digital input signal corresponds to a targ target value for the output voltage so that the output of the subtractor 12 is an error signal 12 being a measure of the difference between the feedback potential to the reference value. This error signal 12 is supplied to a controller 11. The controller 11 is a controller PID type. The controller 11 provides an output signal to a second mode selector switch 14 and the output 7, which may be an actuator signal, not shown here, to drive the desired output voltage.

In one embodiment, the comparator 8 and the comparator 3 together form a comparator 83, where the comparator block 83 includes only a single comparator, whose output is switchably connected to both the successive approximation register 9 and coupled to the output 7. This comparator 83 provides the input for the successive approximation register 9, which in turn controls the output 7 in the first operating mode. In the second operating mode, however, the output 7 is not controlled by the successive approximation register 9 but directly, bypassing the successive approximation register 9, from the comparator 83.

Figure 2:
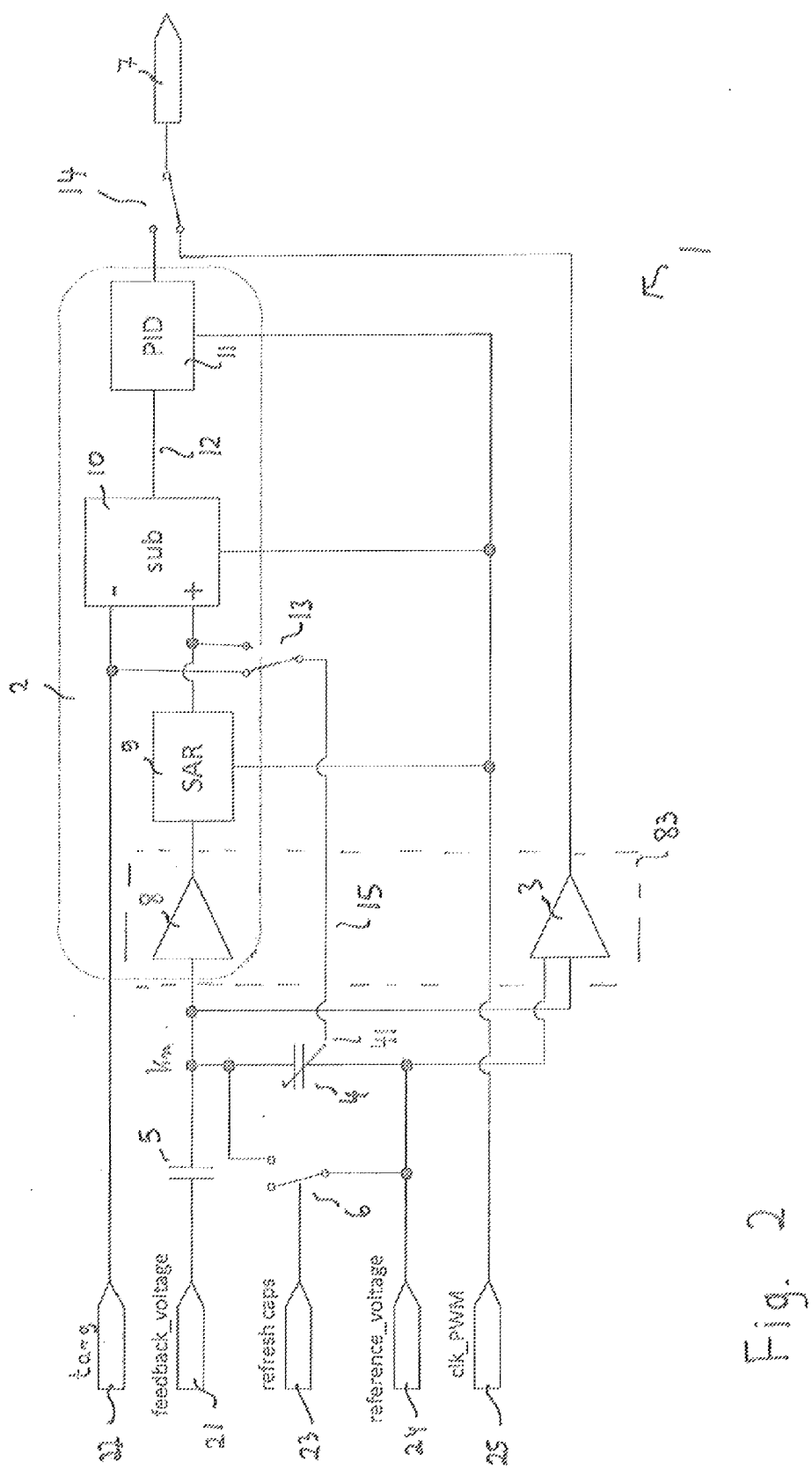
FIG. 2 illustrates the circuit of FIG. 1 implemented to operate in a second operating mode.

FIG. 2 shows the circuit 1 in a second operating mode, also referred to as low-load mode or pulse frequency modulation mode. Here, the first comparator 8, the successive approximation register 9, the subtractor 10 and the controller 11 are turned off, and the first mode switch 13 connects the reference value input 22 to the adjustment input 41, the second mode selector switch 14 connects, in this mode of operation, the output of said second comparator 3 to the output 7.

The variable capacitor 4 is set according to the signal targ, which corresponds to the target value of control. In this mode of operation, the adjustable potential at connection node Kn is compared at the second comparator 3 with the potential at the reference voltage input 24. If the difference between the two potentials falls below a predetermined threshold, the second comparator 3 outputs a pulse of which causes via the output 7, the actuator not shown in the FIG. 2, to vary the output voltage, in most embodiments, by increasing the output voltage.

In normal operation, that is in the first operating mode, the analog to digital converter samples the feedback voltage at a high rate. In contrast, in the low-load operation of the pulse frequency modulation, there should be a continuous and slow observation of the voltage.

The switching power supply transformer according to various embodiments has several operating points or is at least trimable. If a feedback structure between normal and low load operation would be designed differently, the trim options and the programming circuits must be provided for using a plurality of circuits.

The foregoing and the following provide method in which an adjustable capacitor associated with a successive approximation (SAR) ADC may be used in a plurality of operating modes.

The embodiments of the proposed SAR ADC can operate in the mid-load and peak-load operation as conventional SAR ADC. During light load operation in accordance with the PFM, the variable capacitor, which is formed for example as an array of capacitors, is further in use. The other parts of the ADCs are powered down in embodiments. The adjustable capacitor is adjusted by a digital value that is equal to the steady state value of the pulse width modulation. A second comparator detects when the feedback voltage is below a target value and a PFM pulse is required.

From time to time, the capacitor must be refreshed in order to compensate for leakage currents. This is done by a corresponding pulse in the command input 23, which closes the refresh switch 6 for a short period of time. This can take place either during a PFM pulse or if the time between two pulses PFM is equal to or above a predetermined period of time.

Embodiments allow the following advantages:
There needs to be provided only one circuit for selection and for trimming the voltage.
It results in reduced test times and less fuses.
There is no need for additional resistive divider for measuring the feedback voltage.
There is no need to consume surface area for a further programmable resistive divider.
There is no resistor divider, that slows or phase-shifts the operation of the system.
The identical target values for the pulse width modulation control and pulse frequency modulation control prevent voltage transients at the output when switching between modes.
Total power dissipation is reduced.
In embodiments, the refresh circuit of the variable capacitor can be triggered by a low-frequency oscillator.

The target digital values allow observance of multiple voltage levels. By adding an offset to the operating point, so-called steady-state monitoring may be performed in a time-interlaced manner, for example through a window, which is between −10% and +10% of the operating point.

Optionally, a hysterical PFM operation can be implemented by changing the upper voltage value during a PFM pulse.

Figure 3:
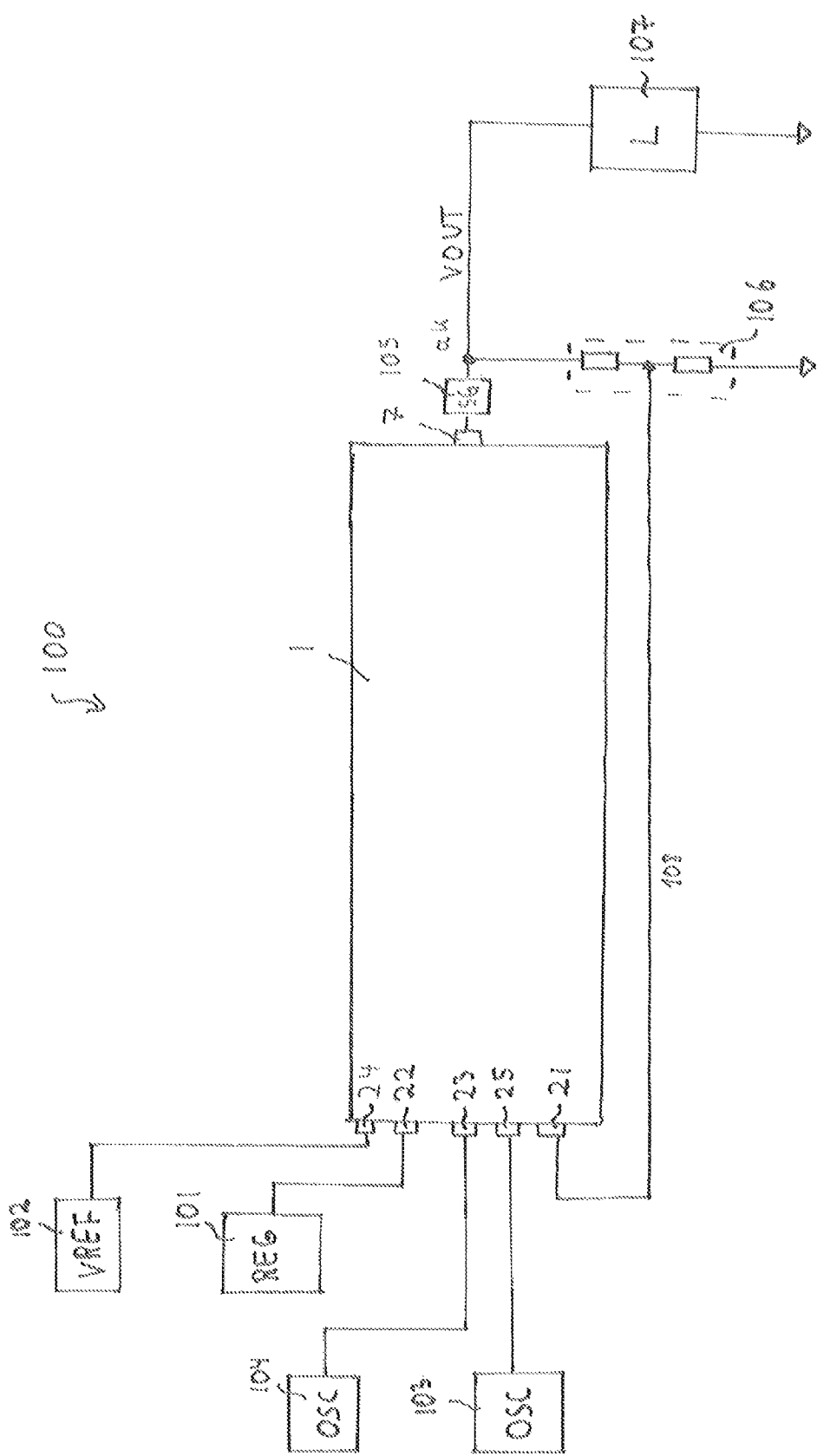
FIG. 3 illustrates a unit for generating an output voltage.

FIG. 3 illustrates a unit 100 for generating an output voltage VOUT. This unit 100 comprises a circuit 1, as is illustrated in FIGS. 1 and 2. In addition, the unit 100 includes a register 101, a reference voltage generator 102, a clock oscillator 103, a low power oscillator 104, an actuator 105, a resistor divider 106 and a load 107. The output of the register 101 is connected to the reference value at input 22. The register 101 provides the target value for the output voltage, and can be programmed in embodiments from outside the unit 100 by software. In addition, the register 101 can be trimmed in embodiments, that is, the default value of the output voltage can be adjusted by means of fuses.

The reference voltage generator 102 provides at its output a reference voltage to the reference voltage input 24. The reference voltage should be provided during recharging of the capacitor, but limited by an existing output impedance. Outside of which the reference voltage can be stored and provided with the aid of capacitors, wherein the reference voltage generator 102 is switched into a low power mode.

The clock oscillator 103 provides at its output a clock for the clock input 25. Of the clock oscillator 103, as described above, may be turned off in the second operating mode.

The low power oscillator 104 provides a clock provided at a lower frequency than the clock oscillator 103 and uses less energy than the clock oscillator 103. At the output 7, an input of the actuator 105 is provided which is connected with its output to an output node ak. The actuator 105 is for example a power transistor, whose load path is provided between a power supply voltage, not shown, and the output node ak, while its control terminal is connected to the output 7. Between the output node ak and ground, the load 107 is provided. Thus, the output voltage VOUT is provided across the load 107. Parallel with the load 107, the voltage divider 106 is also provided which includes two series-connected resistors. The connection node of the two resistors is connected via the feedback path 108 to the analog input 21.

Although the present invention is described above with reference to a preferred exemplary embodiment, it is not restricted thereto but rather can be modified in a variety of ways.

We claim:

1. A circuit, comprising:
a successive approximation register;
an adjustable capacitor having a set input for setting a capacitance value of the adjustable capacitor;
a comparator coupled to an input terminal of the adjustable capacitor, and at least one output coupled to an input of the successive approximation register; and
an analog input coupled to a terminal of the adjustable capacitor,
wherein the circuit is configured to operate in a first operating mode and a second operating mode, and wherein an output of the circuit is controlled by the successive approximation register in the first operating mode and the output of the circuit is not controlled by the successive approximation register in the second operating mode, the output of the circuit being controlled by an output of the comparator in the second operating mode.

2. The circuit according to claim 1, wherein the successive approximation register is disabled during the second operating mode.

3. The circuit according to claim 1, wherein the comparator comprises a plurality of comparators including a second comparator coupled to a terminal of the adjustable capacitor, and a first comparator coupled to another terminal of the adjustable capacitor, the first comparator having an output coupled to an input of the successive approximation register.

4. The circuit according to claim 3, wherein the second comparator is disabled during the first operating mode.

5. The circuit according to claim 1, wherein the set input is coupled to an output of the successive approximation register during the first operating mode.

6. The circuit according to claim 1, wherein the set input is coupled to an output of another register during the second operating mode.

7. The circuit according to claim 6, wherein the another register provides an output signal to a reference value input of the circuit, and wherein the reference value input is coupled to an input of a subtractor at least during the first operating mode, the subtractor having another input coupled to an output of the successive approximation register.

8. The circuit according to claim 1, further comprising a switch functional enable charging of the adjustable capacitor.

9. The circuit according to claim 8, further comprising a low power oscillator for controlling the switch.

10. The circuit according to claim 1, for the comprising a controller, the controller coupled to an output of the successive approximation register and further coupled to an output of the circuit.

11. The circuit according to claim 1, further comprising a clock oscillator to generate a clock signal to disable the successive approximation register during the second operating mode.

12. The apparatus, comprising:
a circuit according to claim 1;
an actuator to generate an output voltage, the actuator having an input coupled to the output of the circuit; and
a feedback path to provide the output voltage to the analog input.

13. A method to regulate an output voltage, comprising:
in a first operating mode, operating an analog-to-digital converter with a successive approximation register by adjusting an adjustable capacitor having a terminal coupled to a feedback path that is coupled to the output voltage, and driving an actuator for providing the output voltage in response to an output of the successive approximation register; and
in a second operating mode, operating a comparator having a terminal coupled to the adjustable capacitor and driving the actuator for providing the output voltage in response to an output signal from the comparator and independent of the successive approximation register.

14. The method according to claim 13, further comprising disabling the successive approximation register in the second operating mode.

15. The method according to claim 13, further comprising disabling the comparator in the first operating mode.

16. The method according to claim 13, wherein the adjustable capacitor is enabled in the second operating mode by a register.

17. The method according to claim 13, further comprising bypassing the successive approximation register in the second operating mode.

18. The method according to claim 13, further comprising toggling a switch coupled to an output of the comparator to a closed state in the second operating mode and toggling the switch to an opened state in the first operating mode.

\* \* \* \* \*